(12) United States Patent
Awad et al.

(10) Patent No.: US 6,894,382 B1
(45) Date of Patent: May 17, 2005

(54) OPTIMIZED ELECTRONIC PACKAGE

(75) Inventors: Elie Awad, Essex Junction, VT (US); John J. Maloney, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/754,206

(22) Filed: Jan. 8, 2004

(51) Int. Cl.⁷ .............................................. H01L 23/48
(52) U.S. Cl. ..................... 257/697; 257/690; 257/678
(58) Field of Search ................................. 257/697, 690, 257/678, 782–786, 669, 674; 438/123, 106, 121, 613, 110, 617

(56) References Cited

U.S. PATENT DOCUMENTS

| | | | |
|---|---|---|---|
| 5,639,694 A | 6/1997 | Diffenderfer et al. | 437/209 |
| 5,814,877 A | 9/1998 | Diffenderfer et al. | 257/666 |
| 6,072,239 A | 6/2000 | Yoneda et al. | 257/730 |
| 6,376,921 B1 | 4/2002 | Yoneda et al. | 257/787 |
| 6,455,348 B1 | 9/2002 | Yamaguchi | 438/106 |
| 6,643,433 B2 | 11/2003 | Fukase et al. | 205/78 |
| 2003/0062628 A1 * | 4/2003 | Lee et al. | 257/777 |
| 2004/0070080 A1 * | 4/2004 | Pendse | 257/778 |
| 2004/0169273 A1 * | 9/2004 | Chiang et al. | 257/734 |
| 2004/0195701 A1 * | 10/2004 | Attarwala | 257/783 |

FOREIGN PATENT DOCUMENTS

| | | |
|---|---|---|
| JP | 3007833 A | 1/1991 |
| JP | 3007833 B2 | 11/1999 |

* cited by examiner

*Primary Examiner*—Eddie Lee
*Assistant Examiner*—Douglas W. Owens
(74) *Attorney, Agent, or Firm*—George R. McGuire; Bond, Schoeneck & King PLLC

(57) ABSTRACT

An electronic package for use with a printed circuit board is provided. The electronic package includes a ground layer having an upper and lower section, a semiconductor chip, a conductive signal layer and a ground plane having a first section electrically connected to the upper section of the ground layer and a second section substantially planar with said lower section of said ground layer, the second section of the ground plane having an additional area to prevent cracking of a solder connection between the ground layer, the ground plane and the printed circuit board.

25 Claims, 9 Drawing Sheets

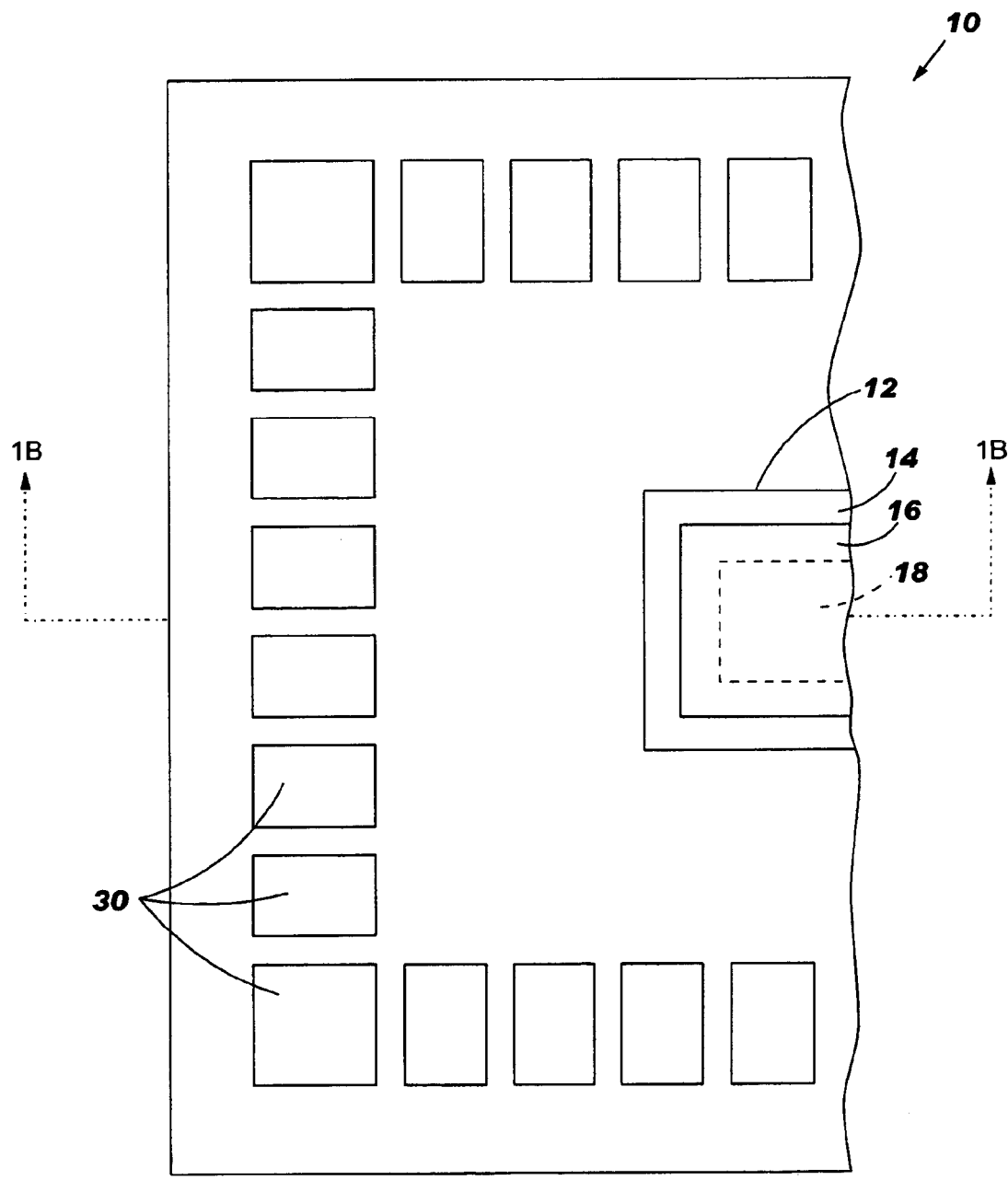

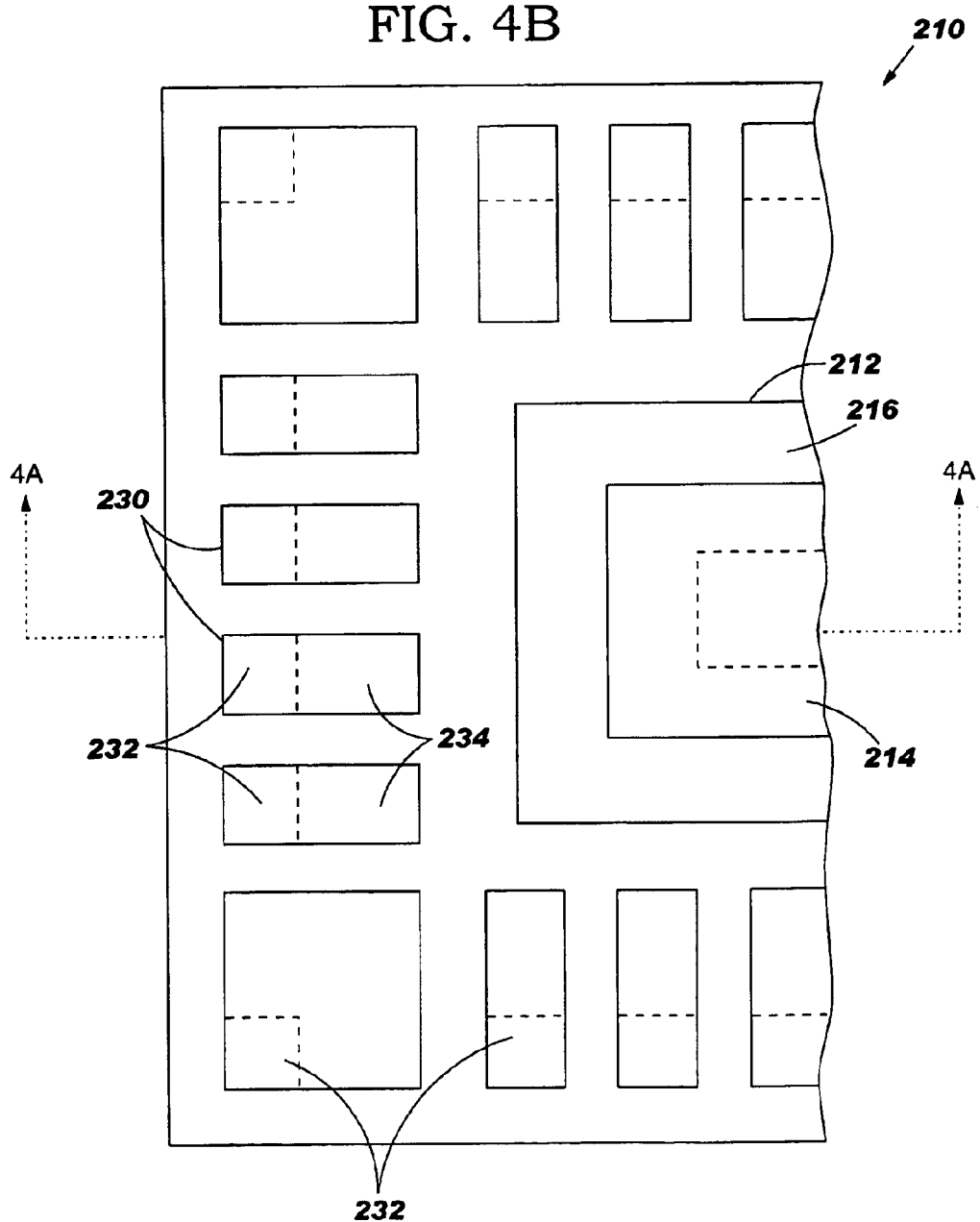

OPTIMIZED ELECTRONIC PACKAGE

TECHNICAL FIELD

This invention relates to an electronic package for use in packaging semiconductors, and more particularly to such packages where an electronic device (e.g. semiconductor chip) is located on a substrate and coupled thereto.

BACKGROUND OF THE INVENTION

Electronic packages are widely used in a variety of well-known applications from computers to computer controls of a wide variety of devices, for example, automobiles and home appliances, among others. Electronic packages for complex systems typically are comprised of interconnected integrated circuit chips. The integrated circuit chips are usually made from a semiconductor material such as silicon or gallium arsenide. Microscopic circuits are formed in the various layers of the integrated circuit chips using known photolithographic techniques. The integrated circuit chips may be mounted in a package which may then mounted on a printed circuit board. Electronic packages including integrated circuit chips typically have numerous external pads which are mechanically attached by solder or a variety of other known techniques to conductor patterns on the printed circuit board.

Typically, the package on which these integrated semiconductor chips are mounted includes a substrate or other chip mounting device. One example of such a substrate is a leadframe. High performance leadframes typically include at least an area on which a semiconductor integrated chip is mounted and a plurality of power, ground, and or signal planes or layers to which power, ground, and/or signal sites of the integrated semiconductor chip are electrically attached. A semiconductor integrated chip may be attached to the leadframe using adhesive or other techniques for attaching such a chip to a leadframe which are commonly known to those skilled in the art, such as soldering. The power, ground, and signal sites on the chip may then be electrically connected to selected power, ground, and signal planes or layers by wires.

Once a semiconductor chip is attached to the leadframe and the electrical connections to the leadframe made, the leadframe may be enclosed or encapsulated in a protective enclosure. Such enclosures may include encapsulation in plastic or a multi-part housing made of plastic, ceramic, or metal or combinations, thereof. The enclosure may protect the leadframe and the attached chip from physical, electrical, and/or chemical damage. The leadframe and attached chip may then be mounted on, for example, a printed circuit board or card, preferably by a plurality of solder connections or joints. The printed circuit board or card may then be incorporated into a wide variety of devices such as computers, automobiles, appliances, among others.

FIG. 1A shows a much enlarged bottom view of a portion of a prior art electronic package 10. FIG. 1B shows a much enlarged view, in elevation of the portion of prior art electronic package 10 taken along line 1B—1B in FIG. 1A. Referring to FIG. 1B, package 10 includes a ground layer 12 having an upper section 14 and a lower section 16 and a semiconductor chip 18. The semiconductor chip 18 has a first surface 20 and a second surface 22. A first conductive pad 24 on second surface 22 of semiconductor chip 18 is electrically connected to upper section 14 of ground layer 12 by wire 26 (ground wire). A second conductive pad 28 on second surface 22 of semiconductor chip 18 is electrically connected to a conductive signal layer 30 by another wire 32 (signal wire). A first solder connection 34 (shown in phantom) electrically and mechanically connects ground layer 12 with a printed circuit board 36 (shown in phantom). A second solder connection 38 (shown in phantom) electrically and mechanically connects conductive signal layer 30 with printed circuit board 36. Electronic package 10 accommodates a standard semiconductor chip having the maximum size allowed in the industry.

FIG. 1C shows a much enlarged bottom view of a portion of another prior art electronic package 11. FIG. 1D shows a much enlarged view, in elevation of the portion of prior art electronic package 11 taken along line 1D—1D in FIG. 1C. Referring to FIG. 1D, package 11 includes a ground layer 13 having an upper section 15 and a lower section 17 and a semiconductor chip 19. The semiconductor chip 19 has a first surface 21 and a second surface 23. A first conductive pad 25 on second surface 23 of semiconductor chip 19 is electrically connected to upper section 15 of ground layer 13 by wire 27 (ground wire). A second conductive pad 29 on second surface 23 of semiconductor chip 19 is electrically connected to a conductive signal layer 31 by another wire 33 (signal wire). A first solder connection 35 (shown in phantom) electrically and mechanically connects ground layer 13 with a printed circuit board 37 (shown in phantom). A second solder connection 39 (shown in phantom) electrically and mechanically connects conductive signal layer 31 with printed circuit board 37. In wirebonded packages, for performance reasons, it is important to design packages with the shortest length of wires possible. Shorter wires yield smaller inductances. In this prior art package, the package has been customized for a small semiconductor chip by designing upper section 15 closer to semiconductor chip 19 than in electronic package 10 to minimize the length of wire 27. This results in a reduced area 17 available to be soldered by solder connection 35 to printed circuit board 37. During process handling of electronic package 11 stresses can be generated in first solder connection 35 and second solder connection 39. Stresses can be generated in these solder connections during assembly of other components (not shown) on printed circuit board 37. During operation of electronic package 11, mounted on printed circuit board 37, stresses are generated in first solder connection 35 and second solder connection 39 caused by a mismatch in the coefficient of thermal expansion (CTE) between electronic package 11 and printed circuit board 37. These handling, assembly, and CTE stresses can cause first solder connection 35 and/or second solder connection 39 to prematurely fail affecting both product cost (lower yields) and reliability. Furthermore, signal wire 33 is very long relative to wire 27 and has marginally poor signal inductance.

Thus it is desirable to have an electronic package that substantially inhibits or prevents cracking of the first solder connection caused by handling, assembly, or field operation. It is also desirable to have an electronic package which has a shorter signal wire and resultantly improved performance (lower signal inductance) during operation. Packages of this type will have improved yield, improved performance and increased operation field life.

OBJECTS AND SUMMARY OF THE INVENTION

Accordingly, it is the object of this invention to enhance the art of packaging technology.

It is another object of this invention to provide an electronic package that will be manufactured in such a manner that has increased yields and can be produced at a relatively lower cost than many current products.

It is yet another object of the invention to provide an electronic package that substantially prevents cracking of a solder connection between a ground layer and ground plane of the electronic package and a printed circuit board.

It is still yet another object of the invention to provide an electronic package that includes a signal wire connected between a conductive pad on the surface of a semiconductor chip and a conductive signal layer, the wire having a length adapted to maintain signal self inductance below 2 nano-Henries (nH).

According to one aspect of the invention, there is provided an electronic package for use with a printed circuit board comprising a ground layer having an upper and lower section and a semiconductor chip having a first surface and a second surface, the first surface on and electrically coupled to the lower section of the ground layer, the second surface of the semiconductor chip having a first conductive pad adapted for being electrically connected to the upper section of the ground layer and a second conductive pad. The electronic package includes a conductive signal layer having a portion substantially planar with the lower section of the ground layer, the portion of the signal layer adapted for being electrically connected to the second conductive pad and a ground plane having a first section electrically connected to the upper section of the ground layer and a second section substantially planar with the lower section of the ground layer, the second section of the ground plane having an additional area to prevent cracking of a solder connection between the ground layer, the ground plane and the printed circuit board.

According to another aspect of the invention, there is provided an electronic package comprising a ground layer having a lower and upper section, a semiconductor chip having a first surface and a second surface, the first surface on and electrically coupled to the lower section of the ground layer, the second surface of the semiconductor chip having a first conductive pad adapted for being electrically connected to the upper section of the ground layer and a second conductive pad. The electronic package includes a conductive signal layer having a lower section substantially planar with the lower section of the ground layer and an end section electrically connected to a second conductive pad on the second surface of the semiconductor chip by a wire having a length adapted to maintain signal self inductance below 2 nH.

The above objects, advantages, and features of the present invention will become more readily apparent from the following detailed description of the presently preferred embodiments as illustrated in the accompanying drawings.

BRIEF DESCRIPTION OF THE DRAWINGS

FIG. 1A illustrates a much enlarged bottom view of a portion of a prior art electronic package.

FIG. 4B illustrates a much enlarged bottom view of the portion of the electronic package of FIG. 4A.

BEST MODE FOR CARRYING OUT THE INVENTION

Figure 1B:
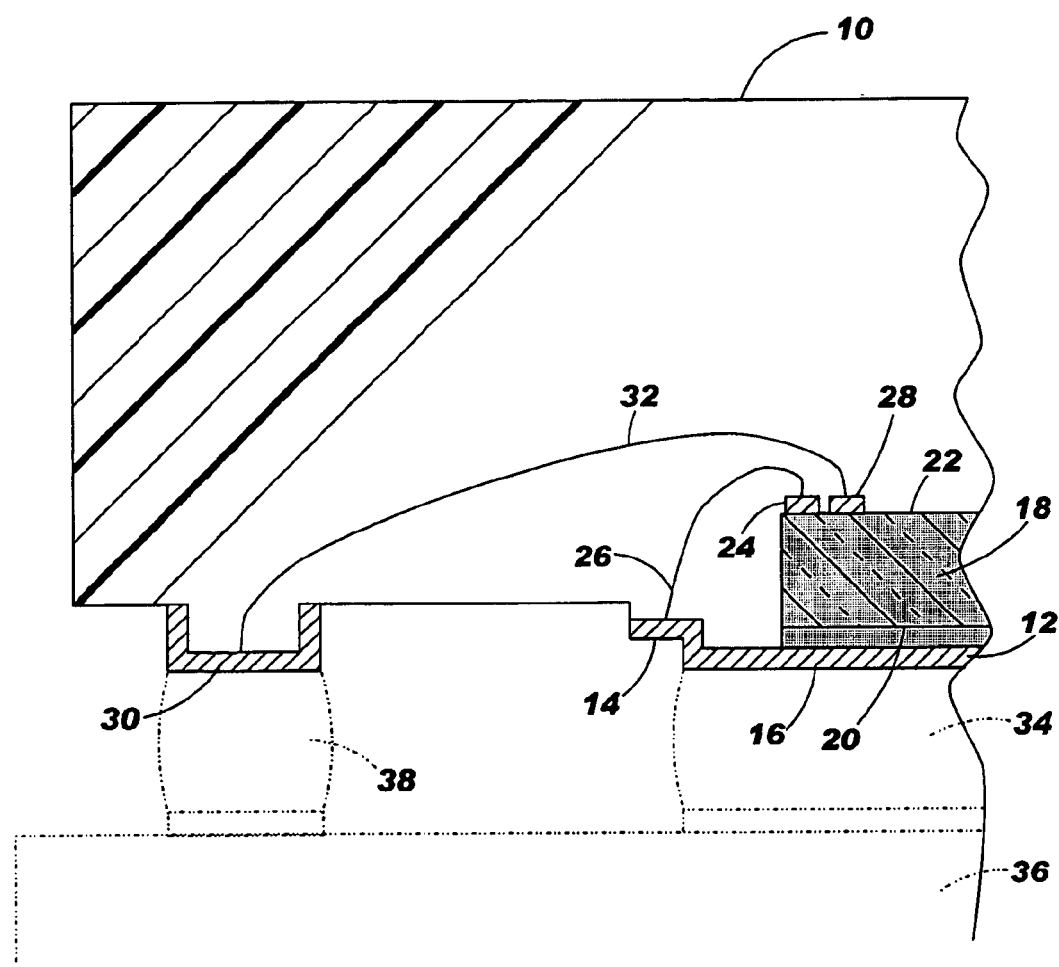
FIG. 1B illustrates a much enlarged view, in elevation, of the portion of the prior art electronic package of FIG. 1A, taken along line 1B—1B in FIG. 1A.
Figure 1C:
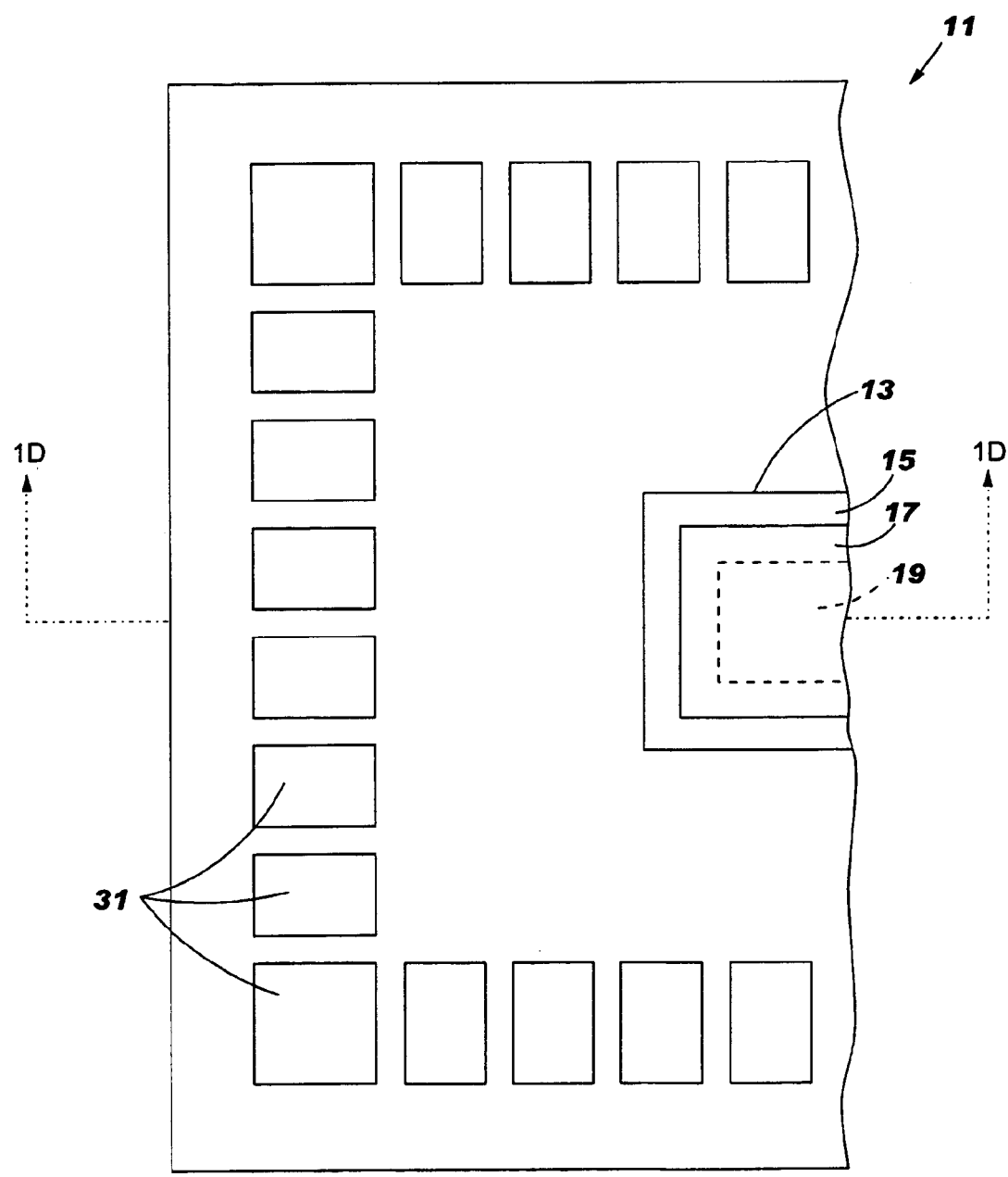
FIG. 1C illustrates a much enlarged bottom view of a portion of another prior art electronic package.
Figure 1D:
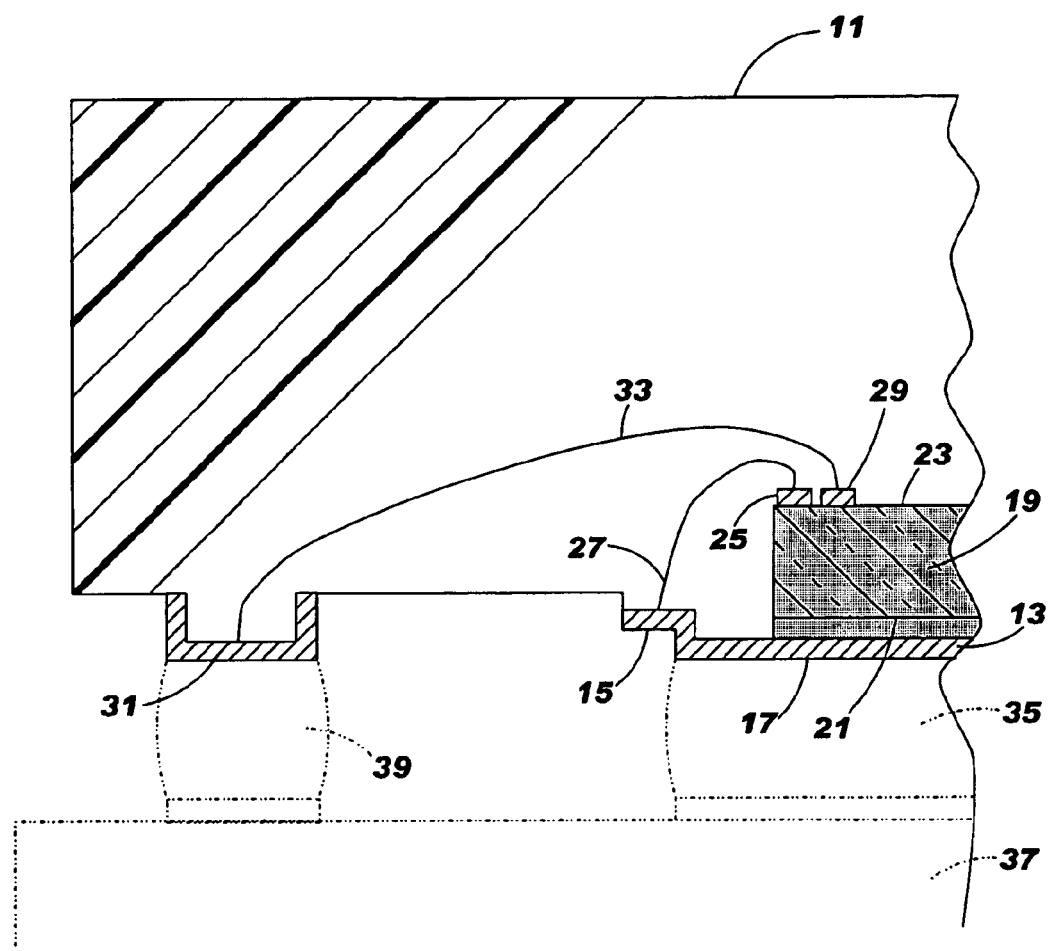
FIG. 1D illustrates a much enlarged view, in elevation, of the portion of the prior art electronic package of FIG. 1C, taken along line 1D—1D in FIG. 1C.
Figure 2A:
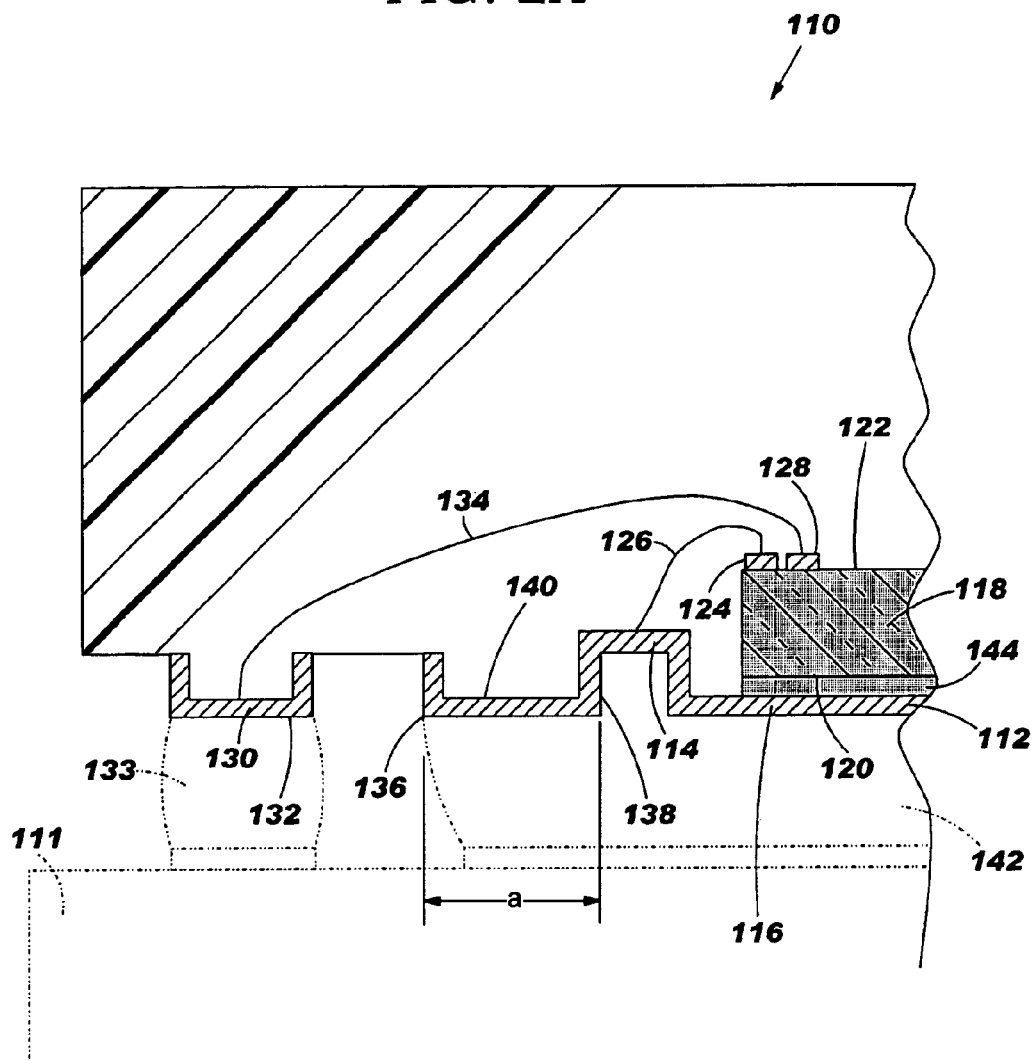
FIG. 2A illustrates a much enlarged view, in elevation, of one embodiment of a portion of the electronic package of the present invention taken along line 2A—2A in FIG. 2B.
Figure 2B:
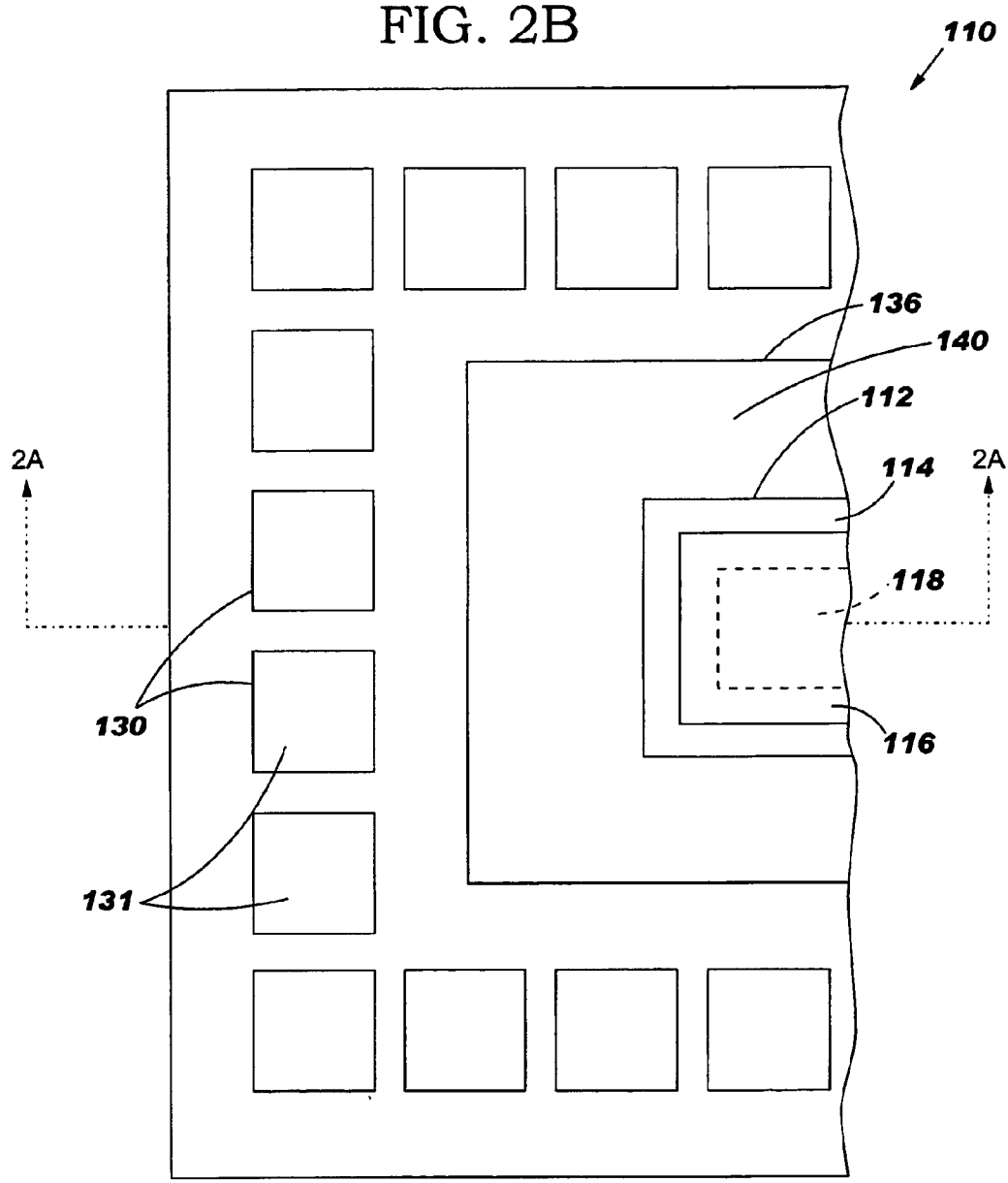
FIG. 2B illustrates a much enlarged bottom view of the portion of the electronic package of FIG. 2A.

A portion of electronic package 110 for use with a printed circuit board 111 (shown in phantom) illustrating one embodiment of the present invention is shown in FIG. 2A. FIG. 2A shows a much enlarged view, in elevation, of a portion of electronic package 110 taken along line 2A—2A in FIG. 2B. FIG. 2B shows a bottom view of the portion of electronic package 110 shown in FIG. 2A. Referring to FIG. 2A, electronic package 110 includes a ground layer 112 having an upper section 114 and a lower section 116. The electronic package 110 includes a semiconductor chip 118 having a first surface 120 and a second surface 122, the first surface on and electrically coupled to lower section 116 of ground layer 112. The second surface 122 of semiconductor chip 118 includes a first conductive pad 124 wirebonded by wire 126 to upper section 114 of ground layer 112 and a second conductive pad 128. A conductive signal layer 130, comprising a plurality of conductive signal pads 131 (see FIG. 2B), includes a portion 132 substantially planar with lower section 116 of ground layer 112. Portion 132 is soldered to printed circuit board 111 by solder connection 133 (shown in phantom) and wirebonded by wire 134 to second conductive pad 128. A ground plane 136 includes a first section 138 that is electrically connected to upper section 114 of ground layer 112 and a second section 140 substantially planar with lower section 116 of the ground layer, the second section of the ground plane having an additional area, (described in more detail below), a portion of which is shown by the letter a, to prevent cracking of a solder connection 142 (shown in phantom) between ground layer 112, ground plane 136 and printed circuit board 111. Solder connection 142 can undergo forces of different nature such as, but not limited to, those arising from shock or vibration and/or the mismatch of the CTE between printed circuit board 111 and electronic package 110. These forces will translate into stresses which are equal to the applied forces divided by the area of solder coverage. Thus for a specific package size, the larger the area of solder coverage, the lower the stresses and therefore the higher the reliability and lifetime of the electronic package/printed circuit board assembly. The second section 140 of ground plane 136 serves the purpose of increasing the overall area over which forces can be distributed. Second section 140 is especially important when relatively small die are packaged in relatively large packages using known designs. In known designs, an upper section of a ground layer is brought closer to a die to shorten the span of wirebonds, however, in doing so the overall size of the ground layer is significantly reduced. For example for a 9 mm square package (9 mm×9 mm) with a 3 mm square die size (3 mm×3 mm), the solder connection area would be only about 10 mm². The invention utilizes a second section 140 which significantly increases the total area of solder resulting in a significant reduction in stresses. The ground layer 112 is comprised of a metal selected from the group consisting of palladium, nickel, and gold or alloys thereof and has a thickness of about 6 micrometers (l). Ground layer 112, when viewed from the bottom of package 110, has the shape of a quadrilateral (partial view shown in FIG. 2B) with an area of from about 9 square millimeters ($mm^2$) to 41 $mm^2$. Semiconductor chip 118 is electrically coupled to lower section 116 of ground layer 112 by a silver filled epoxy 144. Examples of commercially available silver filled epoxies that can be used in this invention are Ablebond 8290 and Ablebond 84-1LMIS both available from Ablestick Company, 20021 Susana Road, Rancho Dominguez, Calif. 90221 and Hysol QMI 519 available from Loctite Corporation, 9938 Via Pasar, San Diego, Calif. 92126. The first conductive pad 124 is electrically connected to upper section 114 of ground layer 112 by at least one gold wire having a length of from about 0.45 mm to about 2.3 mm. The first conductive pad 124 is one of a plurality of first conductive pads (not shown) on second surface 122 of semiconductor chip 118. This electrical connection serves as a ground connection for semiconductor chip 118. The advantage to upper section 114 being raised above the plane of lower section 116 is that it allows for a wirebond 126 to be short in length. Another advantage is that the volume of solder under upper section 114 and adjacent first section 138 provides a solder locking mechanism when electronic package 110 and printed circuit board 111 are assembled and under thermal and/or mechanical stress. The plurality of conductive signal pads 131 (FIG. 2B) each has an area when viewed from the bottom of package 110 of from about 0.11 $mm^2$ to about 0.19 $mm^2$. Signal layer 130 is electrically connected to second conductive pad 128 on second surface 122 of semiconductor chip 118 by a gold wire having a length of from about 0.75 mm to about 2.5 mm. Second conductive pad 128 is one of a plurality of conductive pads on second surface 122 of semiconductor chip 118, selected ones of the plurality of signal pads 131 are electrically connected to selected ones of the plurality of conductive pads by a plurality of gold wires having dimensions, as described above. The ground plane is comprised of a metal selected from the group consisting of palladium, nickel, and gold or alloys thereof.

Figure 3:
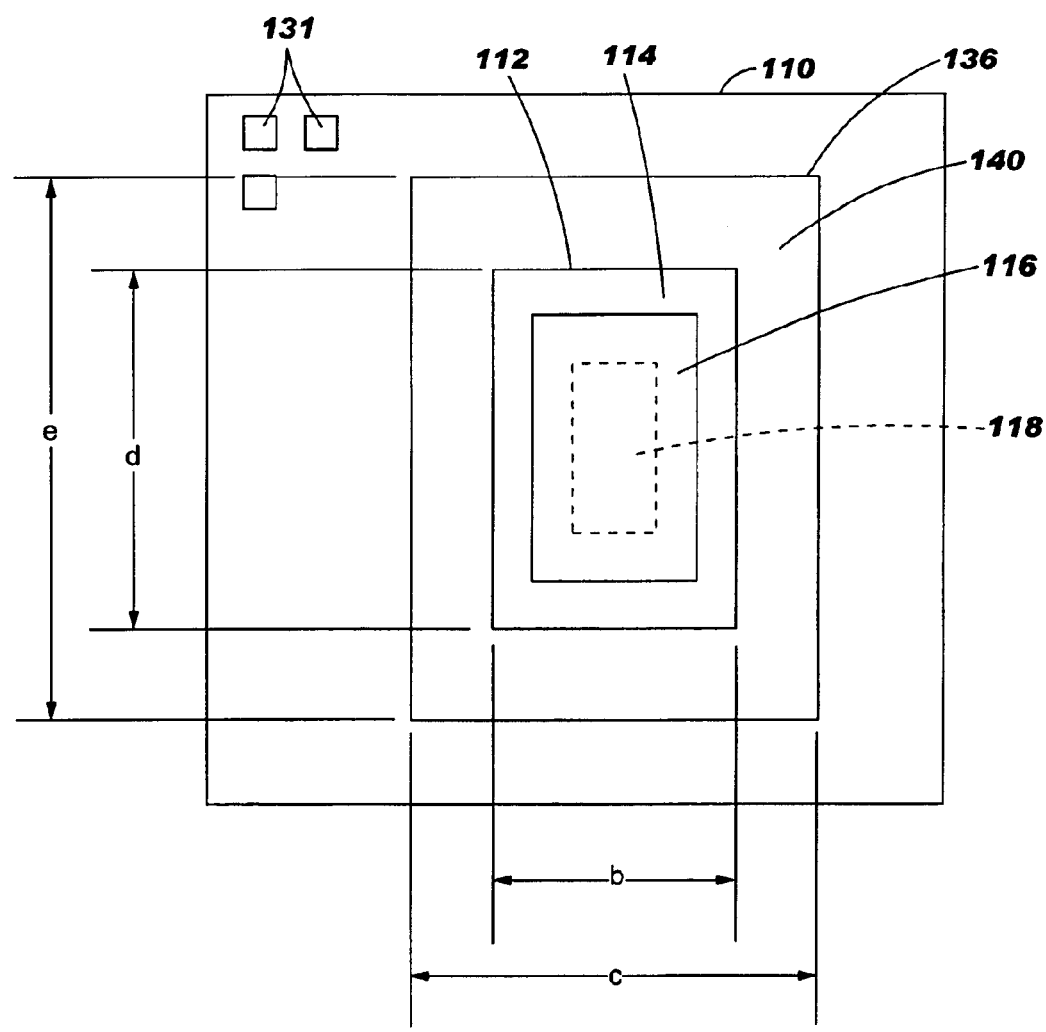
FIG. 3 illustrates a much enlarged full bottom view of the electronic package (only partially shown in FIG. 2B) showing the additional area of the second section of the second ground plane as a quadrilateral annulus.

Referring to FIG. 3, a much enlarged full bottom view of electronic package 110 is shown. The second section 140 of ground plane 136 is shown as the shape of a quadrilateral annulus defined as the area (c×e) minus (b×d). The area of the quadrilateral annulus can be from about 8 $mm^2$ to about 34 $mm^2$.

Figure 4A:
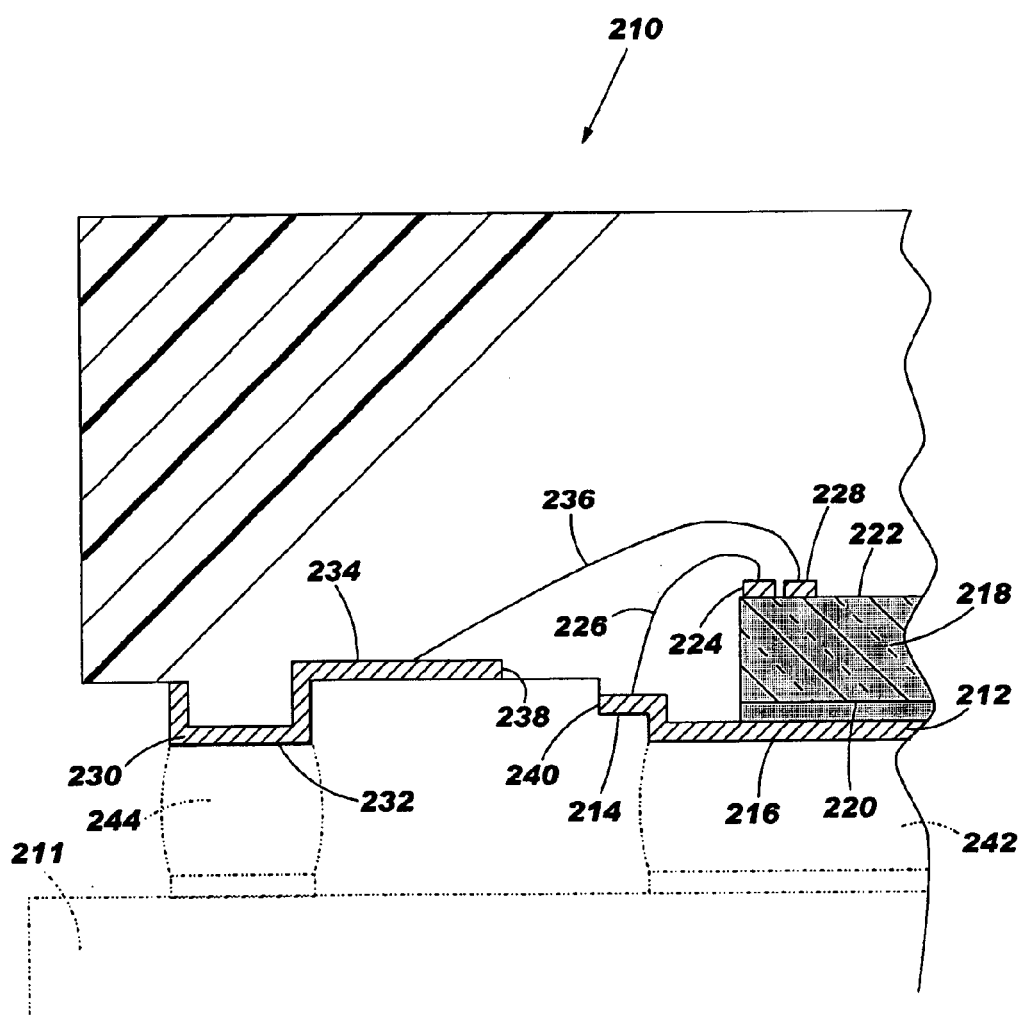
FIG. 4A illustrates a much enlarged view, in elevation, of another embodiment of a portion of the electronic package of the present invention taken along line 4A—4A in FIG. 4B.

A portion of electronic package 210 for use with a printed circuit board 211 (shown in phantom) illustrating another embodiment of the present invention is shown in FIG. 4A. FIG. 4A shows a much enlarged view, in elevation of a portion of electronic package 210 taken along line 4A—4A in FIG. 4B. FIG. 4B shows a bottom view of the portion of electronic package 210 shown in FIG. 4A. Referring to FIG. 4A electronic package 210 includes a ground layer 212 having an upper section 214 and lower section 216. The electronic package 210 includes a semiconductor chip 218 having a first surface 220 and a second surface 222, the first surface on and electrically coupled to lower section 216 of ground layer 212. The second surface 222 of semiconductor chip 218 includes a first conductive pad 224 wirebonded by wire 226 to upper section 214 of ground layer 212 and a second conductive pad 228. A conductive signal layer 230 includes a lower section 232 substantially planar with lower section 216 of ground layer 212 and an end section 234 electrically connected to second conductive pad 228 on second surface 222 of semiconductor chip 218 by a wire 236 having a length adapted to maintain signal self inductance below 2 nH by shortening the length of the wire. Wire 236 is a signal carrying wire. Self inductance can be defined as the inducing of a voltage in a current carrying wire when the current in the wire itself is changing (AC current). Self induced voltage opposes changes in the current in the wire. In a high frequency application the current is constantly changing, therefore inductance in a high frequency application, 100 Megahertz and higher, causes continual opposition. The opposition to current flow is called inductive reactance and inductive reactance is directly proportional to the amount of inductance of the circuit (bondwire). Shorter wirebonds (wire 236) mean lower inductance which means less inductive reactance and less opposition to the flow of the current through the wirebond. The ground layer 212 is comprised of a metal selected from the group consisting of palladium, nickel, or gold or alloys thereof and has a thickness of about 6μ. Ground layer 212 when viewed from the bottom of package 210, has the shape of a quadrilateral (only partial view shown in FIG. 4B) with an area of from about 9 $mm^2$ to about 41 $mm^2$. Semiconductor chip 218 is electrically coupled to lower section 216 of ground layer 212 by a silver filled epoxy, as described above. The first conductive pad 224 is electrically connected to upper section 214 of ground layer 212 by a gold wire having a length of from about 0.45 mm to about 2.3 mm. The first conductive pad 224 is one of a plurality of first conductive pads (not shown) on second surface 222 of semiconductor chip 218. The lower section 232 of conductive signal layer 230 comprises a plurality of conductive signal pads (see FIG. 4B) each having an area of from about 0.11 $mm^2$ to about 0.19 $mm^2$. The end section 234 of conductive signal layer 230 has a length of from about 0.5 mm to about 1.75 mm and is electrically connected to second conductive pad 228 on second surface 222 of semiconductor chip 218 by a gold wire 236 having a length of from about 0.75 mm to about 1.75 mm. The conductive signal layer 230 is comprised of a metal selected from the group consisting of palladium, nickel, and gold or alloys thereof. The end section 234 of conductive signal layer 230 includes an edge 238 positioned at least a distance 0.20 mm from an edge 240 of upper section 214 of ground layer 212. A first solder connection 242 (shown in phantom) electrically and mechanically connects lower section 216 of ground layer 212 with printed circuit board 211. A second solder connection 244 (shown in phantom) electrically and mechanically connects lower section 232 of conductive signal layer 230 with printed circuit board 211. The end section 234 of conductive signal layer 230 is positioned a distance of about 0.75 mm above section 232 of the conductive signal layer to prevent solder from first solder connection 242 from contacting the end section during formation of the first solder connection.

We claim:

1. An electronic package for use with a printed circuit board comprising:

a ground layer having an upper and lower section;

a semiconductor chip having a first surface and a second surface, said first surface said lower section of said of said semiconductor chip on and electrically coupled to ground layer, said second surface having a first conductive pad adapted for being electrically connected to said upper section of said ground layer and a second conductive pad;

a conductive signal layer having a portion substantially planar with said lower section of said ground layer, said portion of said signal layer adapted for being electrically connected to said second conductive pad; and a ground plane having a first section electrically connected to said upper section of said ground layer and a second section substantially planar with said lower section of said ground layer, said second section of said ground plane having an additional area to prevent cracking of a solder connection between said ground layer, said ground plane and said printed circuit board.

2. The electronic package of claim 1, wherein said ground layer is comprised of a metal selected from the group consisting of palladium, nickel, and gold or alloys thereof.

3. The electronic package of claim 2, wherein said ground layer has a thickness of about 6 micrometers.

4. The electronic package of claim 3, wherein said ground layer has an area of about 9 mm$^2$ to about 41 mm$^2$.

5. The electronic package of claim 1, wherein said semiconductor chip is electrically coupled to said lower section of said ground layer by a silver filled epoxy.

6. The electronic package of claim 1, wherein said first conductive pad is electrically connected to said upper section of said ground layer by a gold wire having a length of from about 0.45 mm to about 2.3 mm.

7. The electronic package of claim 1, wherein said portion of said conductive signal layer substantially planar with said lower section of said ground layer comprises a plurality of conductive signal pads each having an area of from about 0.11 mm$^2$ to about 0.19 mm$^2$.

8. The electronic package of claim 7, wherein said portion of said conductive signal layer is electrically connected to said second conductive pad on said second surface of said semiconductor chip by a gold wire having a length of from about 0.75 mm to about 2.5 mm.

9. The electronic package of claim 1, wherein said ground plane is comprised of a metal selected from the group consisting of palladium, nickel, and gold or alloys thereof.

10. The electronic package of claim 1, wherein said second section of said ground plane has a shape of a quadrilateral annulus.

11. The electronic package of claim 10, wherein said shape of said second section of said ground plane has an area of from about 8 mm$^2$ to about 34 Mm$^2$.

12. An electronic package comprising:

a ground layer having an upper and lower section;

a semiconductor chip having a first surface and a second surface, said first surface on and electrically coupled to said lower section of said ground layer, said second surface of said semiconductor chip having a first conductive pad adapted for being electrically connected to said upper section of said ground layer and a second conductive pad; and a conductive signal layer comprising a lower section extending along a first plane substantially planar with said lower section of said ground layer and an end section extending alone a second plane in spaced, substantially parallel relation to said first plane, wherein said end section is positioned relative to said second conductive pad on said second surface of said semiconductor chip to maintain signal self inductance below 2 nano-henries.

13. The electronic package of claim 12, wherein said ground layer is comprised of a metal selected from the group consisting of palladium, nickel, and gold or alloys thereof.

14. The electronic package of claim 13, wherein said ground layer has a thickness of about 6 micrometers.

15. The electronic package of claim 14, wherein said lower section of said ground layer has an area of from about 9 mm$^2$ to about 41 mm$^2$.

16. The electronic package of claim 12, wherein said semiconductor chip is electrically coupled to said lower section of said ground layer by a silver filled epoxy.

17. The electronic package of claim 12, wherein said first conductive pad is electrically connected to said upper section of said ground layer by a gold wire having a length of from about 0.45 mm to about 2.3 mm.

18. The electronic package of claim 12, wherein said lower section of said conductive signal layer substantially planar with said lower section of said ground layer comprises a plurality of conductive signal pads each having an area of from about 0.11 m$^2$ to about 0.19 mm$^2$.

19. The electronic package of claim 12, wherein said end section of said conductive signal layer is electrically connected to said second conductive pad on said second surface of said semiconductor chip by a gold wire having a length of from about 0.75 mm to about 1.75 mm.

20. The electronic package of claim 12, wherein said conductive signal layer is comprised of a metal selected from the group consisting of palladium, nickel, and gold or alloys thereof.

21. The electronic package of claim 20, wherein said end section of said conductive signal layer has a length of from about 0.5 mm to about 1.75 mm.

22. The electronic package of claim 20, wherein an edge of said end section of said conductive signal layer is positioned at least a distance of about 0.20 mm from an edge of said upper section of said ground layer.

23. The electronic package of claim 12, further including a first solder connection between said lower section of said ground layer and said printed circuit board.

24. The electronic package of claim 23, further including a second solder connection between said lower section of said conductive signal layer and said printed circuit board.

25. The electronic package of claim 24, wherein said end section of conductive signal layer is positioned a distance of about 0.75 mm above said lower section of said conductive signal layer to prevent said first solder connection from contacting said end section.

* * * * *